(12) United States Patent  (10) Patent No.: US 7,534,555 B2
Bedell et al.  (45) Date of Patent: May 19, 2009

(54) PLATING USING COPOLYMER

(75) Inventors: Daniel W. Bedell, San Jose, CA (US); Gregory Breyta, San Jose, CA (US); Tom K. Harris, III, Morgan Hill, CA (US); April D. Hixson-Goldsmith, Campbell, CA (US); Murali Ramasubramanian, San Jose, CA (US); Alfred Renaldo, San Jose, CA (US); Benjamin L. Wang, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1051 days.

(21) Appl. No.: 10/733,097

(22) Filed: Dec. 10, 2003

(65) Prior Publication Data

US 2005/0130078 A1  Jun. 16, 2005

(51) Int. Cl.
*G03F 1/00* (2006.01)
(52) U.S. Cl. ............... 430/313; 430/322; 430/320; 430/311; 430/324
(58) Field of Classification Search ............. None
See application file for complete search history.

(56) References Cited

U.S. PATENT DOCUMENTS

| 4,814,258 A | 3/1989 | Tam ............... 430/315 |
| 5,006,202 A * | 4/1991 | Hawkins et al. ............... 216/27 |
| 5,017,271 A * | 5/1991 | Whewell et al. ............... 205/125 |
| 5,604,073 A | 2/1997 | Krounbi et al. ............... 430/14 |
| 5,981,135 A | 11/1999 | Koes et al. ............... 430/165 |
| 5,994,430 A | 11/1999 | Ding et al. ............... 524/80 |
| 6,124,405 A | 9/2000 | Mertesdorf et al. ......... 525/312 |
| 6,165,684 A | 12/2000 | Mizutani et al. ......... 430/271.1 |
| 6,218,056 B1 * | 4/2001 | Pinarbasi et al. ............... 430/5 |
| 6,251,562 B1 | 6/2001 | Breyta et al. ............. 430/287.1 |
| 6,866,987 B2 * | 3/2005 | Lee ........................... 430/311 |
| 2001/0005741 A1 | 6/2001 | Breyta et al. ............. 526/218.1 |
| 2002/0015909 A1 | 2/2002 | Mizutani et al. ......... 430/270.1 |

FOREIGN PATENT DOCUMENTS

EP  0341843  11/1989

* cited by examiner

*Primary Examiner*—Mark F Huff
*Assistant Examiner*—Daborah Chacko Davis
(74) *Attorney, Agent, or Firm*—Zilka-Kotab, PC

(57) ABSTRACT

Method of plating using a polymeric barrier layer including a polyphenolic polymer which has a repeating unit of the formula:

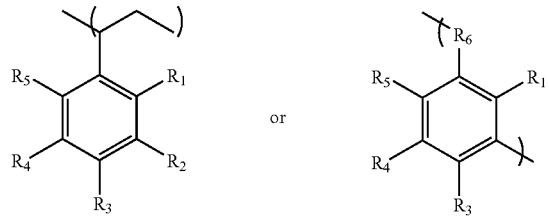

wherein $R_1$, $R_2$, $R_3$, $R_4$, and $R_5$ are individually hydrogen, a hydroxy group or an azo dye.

27 Claims, 5 Drawing Sheets

PLATING USING COPOLYMER

FIELD OF THE INVENTION

The invention relates generally to a process of forming patterned structures on a substrate utilizing plating techniques. More particularly, the invention relates to use of adhesive polymers during such a process.

BACKGROUND OF THE INVENTION

The use of bi-layer resist lift-off processing in the fabrication of integrated circuit components and other thin film structures such as field effect transistors (FET), conductor patterns and magnetic sensing transducers, is well known in the art. For example, U.S. Pat. No. 4,814,258 granted to Tam discloses a bi-layer lift-off process utilized for the fabrication of various types of FETs, and European Patent Application No. 0 341 843 published Nov. 15, 1989 discloses a bi-layer metal lift-off process for forming conductor patterns on a substrate.

Basically, the bi-layer lift-off system comprises a release layer formed on a suitable substrate which is then covered by a top imaging layer of photoresist. A Diazonapthoquinone (DNQ)/Novolac positive resist is suitable for use as the top imaging layer. Polydimethylglutarimide (PMGI), a polymer supplied by the Shipley Company, is a suitable material which is typically used as a release layer. The top imaging layer is exposed and developed to provide the desired pattern. The release layer is then flood exposed and developed to expose the substrate surface for subsequent deposition of the desired structural features. During the development step, the release layer is undercut from the edges of the resist pattern a desired amount to facilitate the subsequent lift-off step.

A major difficulty and limitation of the bi-layer lift-off process utilizing PMGI as the release layer is the loss of, or reduced adhesion of, the PMGI layer to the underlying substrate surface at low prebake temperatures. Good adhesion of PMGI to various substrate materials has been obtained by oven baking at temperatures in the range of 190° to 290° C., near or above the glass transition temperature for the PMGI resin.

However, bake temperatures below 150° C., have resulted in, at best, marginal adhesion characteristics. Further, the relatively high prebake temperatures required for suitable adhesion in PMGI systems can result in oxidation of the underlaying deposition surface, particularly certain metals, further resulting in reduced yields and degraded performance of the finished product.

One solution to this problem is disclosed in Krounbi, et al., U.S. Pat. No. 5,604,073 which teaches enhancing adhesion through addition of azo-type dyes to polydimethylglutarimide. However, this solution still provides results of uncontrolled adhesion failure in some instances and undesirable sublimation of the dye from the film.

The use of patterned photoresist and electroplating, commonly called a plate-through-mask technique, is another method well known the art for the fabrication of integrated circuit components and other thin film structures such as field effect transistors (FET), conductor patterns and magnetic sensing transducers.

For the current generation of write heads in development, high-moment NiFe plating is necessary at P1P and P2 to achieve the targeted magnetic performance. The low temperature and low pH required result in a plating environment with significant stress on the photoresist. As a result of the stress, the photoresist cracks during plating. More particularly, at the highest stress areas, metals press against the walls of the resist structure. The compression against the soft resist causes the resist to deform and crack and/or peel from the surface. The plating solution fills the cracks and if contact is made with the seed layer, NiFe plates in the cracks, forming "fingers" that plate into the cracks. When the resist is removed, the "fingers" of plated metal remain on the substrate in various locations. The unwanted plating adversely affects functionality and reliability of the writer.

As a result, there is a need for compositions and processes which provide films having enhanced adhesion which can also be used in photoresist processes.

There is also a need for compositions and processes which provide films forming a barrier layer that prevents plating into cracks in the resist structure.

SUMMARY OF THE INVENTION

In accordance with a first aspect of the invention, there is provided a method for plating using an adhesive or barrier layer composition having a polyphenolic polymer with repeating monomeric units of the formula:

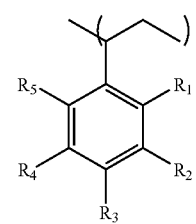

IA wherein $R_1$, $R_2$, $R_3$, $R_4$, and $R_5$ are individually hydrogen, a hydroxy group or an azo dye and wherein at least one of $R_1$, $R_2$, $R_3$, $R_4$, and $R_5$ is a hydroxy group. Optionally, the composition of the invention may be used as a polymeric release layer.

Alternatively, the adhesive composition has a polyphenolic polymer with repeating monomeric units of the formula:

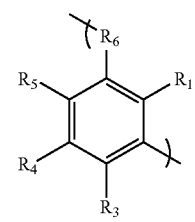

IB wherein $R_1$, $R_3$, $R_4$, and $R_5$ is hydrogen, hydroxy group or an azo dye, $R_6$ is a methylene or substituted methylene and can form a polymeric chain and, optionally, wherein $R_1$, $R_3$, or $R_5$ is a hydroxy group. While the two polymers are interchangeable, the present description shall refer to polymer IA for simplicity, it being understood that the concepts, compositions, and functionality of the described polymer (IA) are applicable to both polymers IA and IB. The present description would also encompass copolymers containing these described monomeric units of the invention copolymerized with other styrenics, with (meth)acrylates and vinyl ethers, esters and alcohols, among others. The polymers of the invention may also be blended with other polymers such as polystyrenes, polyhydroxystyrenes, poly(meth)acrylates, polyimides, polysulfones, vinyl ethers, vinyl alcohols and acetates, among others.

The method for plating includes coating a substrate with an organic barrier layer, where the barrier layer comprises an adhesive composition comprising a polyphenolic polymer having repeating monomeric units described above. The barrier layer is coated with a top layer comprising a photoresist. The top layer is exposed to radiation. The exposed portion of the top layer is removed for exposing a portion of the barrier layer. The exposed portion of the barrier layer is also removed for exposing a portion of the substrate. A material is plated on the exposed portion of the substrate.

Preferably, the barrier layer is spin coated on the substrate, and can ultimately form a monolayer or a thicker layer. The exposed portion of the top layer is removed using a developer. In one embodiment, the developer also removes the exposed portion of the barrier layer. In another embodiment, the developer does not remove the exposed portion of the barrier layer. In such case, the exposed portion of the barrier layer can be removed by reactive ion etching or milling.

Unless desired, removal of the exposed portion of the barrier layer does not create undercuts under the photoresist. An additional benefit is that the barrier layer can be made to function as an antireflective coating.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

Figure 1:
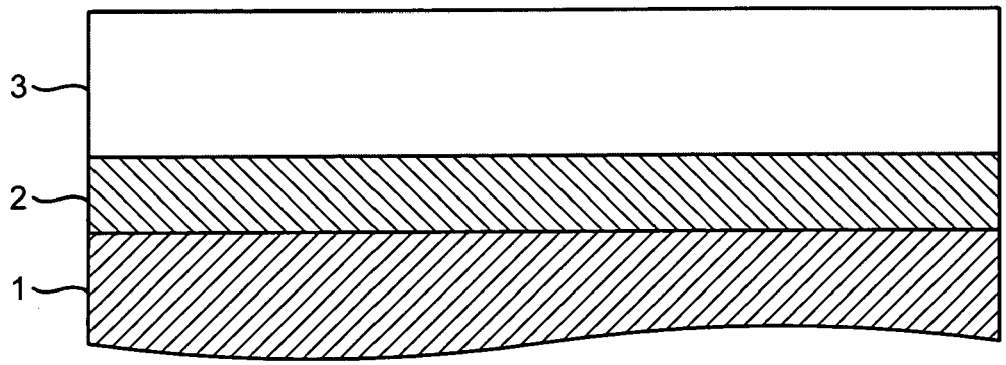
FIGS. 1-4 are cross-sectional views illustrating the structures formed during the steps of a bi-layer lift-off deposition process.

The following description is the best embodiment presently contemplated for carrying out the present invention. This description is made for the purpose of illustrating the general principles of the present invention and is not meant to limit the inventive concepts claimed herein.

The invention is an adhesive and/or barrier layer polymer which incorporates pendent azo dye moieties and methods of using the same in plating.

The Polymer

Incorporation of an azo dye into polyvinylphenol (PVP) and other phenolic polymers has been shown to produce outstanding adhesion onto a variety of substrates such as quartz, alumina, silicon, silicon dioxide, metals and metal alloys.

As described above, a major limitation encountered when using PMGI as the release layer material is loss of adhesion at low prebake temperatures, the low temperatures being required to minimize undesirable oxidation and corrosion of previously formed structural materials. In accordance with the principles of the present invention, the adhesion characteristics of the PMGI are greatly improved by the addition to the PMGI of small amounts of polymeric azo dyes.

Additionally, the adhesion of photoresists to these substrates is improved when using the polymers described in our invention. An added benefit is the ability of these polymers to act as a barrier layer when applied under the photoresist in monolayer or greater thickness to prevent plating from the seed layer into imperfections in the photoresist. Such imperfections in the photoresit may for example be formed during the plating process itself.

Chemically, the azo class is subdivided according to the number of azo groups present into mono-, dis-, tris-, and tetrakis- among others. Azo dyes contain at least one azo group (—N=N—) but can contain two (bisazo), three (trisazo), or, more rarely, four or more (polyazo) azo groups. The azo group is attached to two radicals of which at least one, but more usually, both are aromatic. They exist predominantly in the trans form where the bond angle is about 120° and the nitrogen atoms are sp$^2$ hybridized and may be represented as follows in formula II.

II

In monoazo dyes, the most important type, the A radical often contains electron-accepting groups or donating and the E radical contains electron-donating groups, particularly hydroxy and amino groups, for example a phenolic compound. If the dyes contain only aromatic radicals such as benzene and naphthalene, they are known as carbocyclic azo dyes. If they contain one or more heterocyclic radicals, the dyes are known as heterocyclic azo dyes. In our invention radical E is the polymeric phenol of the composition.

All coupling components used to prepare azo dyes have the common feature of an active hydrogen atom bound to a carbon atom. Compounds of the following types can be used as azo coupling components: (1) aromatic hydroxy compounds such as phenols and naphthols; (2) aromatic amines; (3) compounds that possess enolizable ketone groups of aliphatic character, i.e., compounds that have active methylene groups, where X is an electron attracting group such as —COR, —COOH, —CN, R is alkyl or aryl, and Y is usually a substituted or unsubstituted amino group;

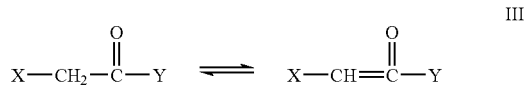

III and (4) heterocyclic compounds such as those containing pyrrole [109-97-7], indole [120-72-9], pyridine [110-86-1], pyrimidine [289-95-2], and similar ring systems, such as 5-pyrazolones.

Analogous to aromatic halogenation, nitration, and sulfonation, the azo coupling reaction is an electrophilic aromatic substitution. The effect of the reaction rate of substituents on both the diazo and the coupler components is in agreement with this mechanism. Thus the reaction is facilitated by electron-attracting groups in the diazo components, and by electron-donating groups in phenol and aromatic amine-type coupler components. The reactivity of coupling components (nucleophilic substrate) increases with increasing basicity. The phenoxide ion (ArO$^-$) and free amine (ArNH$_2$) are more basic than corresponding free phenol and the ammonium ion (C$_6$H$_5$NH$_3^+$) and, therefore, react more easily.

Generally this adhesive composition includes a polyphenolic polymer with repeating monomeric units of the formula:

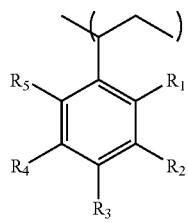

IA wherein R$_1$, R$_2$, R$_3$, R$_4$, and R$_5$ is hydrogen, a hydroxy group or a substituted azo group, and, optionally, wherein only one of R$_1$, R$_2$, R$_3$, R$_4$, and R$_5$ is a hydroxy group.

Alternatively, or in combination with the structure recited immediately above, the adhesive composition can include a polyphenolic polymer with repeating monomeric units of the formula:

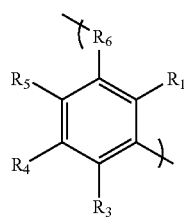

IB wherein R$_1$, R$_3$, R$_4$, and R$_5$ is hydrogen, hydroxy group or a substituted azo group, R$_6$ is a methylene or substituted methylene and, optionally, wherein only one of R$_1$, R$_3$, R$_4$, and R$_5$ is a hydroxy group. Examples of this type of polymer would be novolacs (novolaks) or branched polyvinylphenols.

In any of the above polymeric structures, R$_1$ through R$_5$ may be any different type of azo dyes including a mono azo dye, a diazo dye or a triazole including various aromatic structures phenyl, naphthyl, anthracenyl, among others. Further substituents to these aromatic structures include NO$_2$, SO$_2$Y, COOR, OR, CN, NR$_2$, or halogens wherein R is an alkyl and these substituents may be located at the ortho, meta, or para position. Useful azo dyes include commercially available Fast-Dyes such as:

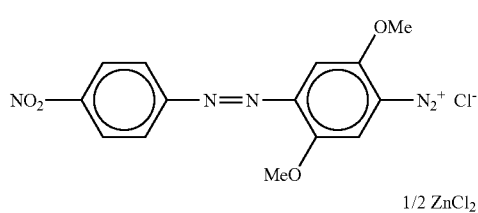

IV

-continued

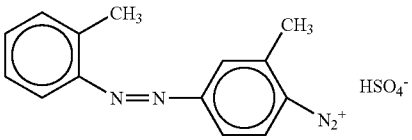

V

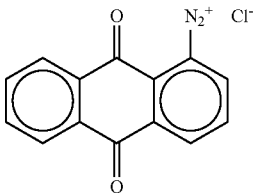

VI

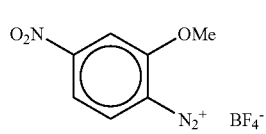

VII

In use, R—R$_5$ may be an azo dye moiety or a triazole moiety comprising alkyl groups, alkyl aryl groups, or substituted or unsubstituted aryl groups such as benzene. These dyes are formed by reaction at the azo functionality to the phenolic site by described electrophilic aromatic substitution reaction commonly known as diazonium coupling reactions.

Two common species of azo substituents may be found in formulas VIII and IX below:

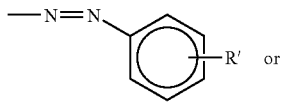

VIII

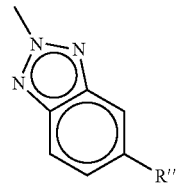

IX

Typically R' and R" include H; —OH; a C1-12 branched or linear alkyl; an OR''' groups where R''' may be C$_1$-C$_5$ alkyl groups such as —OCH$_3$, OCH$_2$CH$_3$, —OCH$_2$CH$_2$CH$_3$; —COOH; —COCH$_3$; —COCH$_2$CH$_3$; —COCH$_2$CH$_2$CH$_3$; SO$_3$H; and SO$_2$NH$_2$ and among others.

The resulting polymer generally has a molecular weight (weight average) ranging from about 500 to 80,000, and preferably from about 1000 to 15,000. The solubility of the polymer may be varied by tailoring the molecular weight or by including pendent moieties with varying pH sensitivities. For example, as the molecular weight of the polymer increases solubility generally decreases. Further, use of dye moieties with acidic pendent groups generally increases solubility in alkaline solutions. In turn, use of dye moieties with alkyl or alkoxy pendent groups generally decreases solubility in alkaline developer.

The utility of our invention extends to copolymers containing the described monomeric units of our invention. Examples include copolymers with other vinylics including other styrenics, with (meth)acrylates and vinyl ethers, esters and alcohols, among others. Copolymers containing multiple azo-dye moieties are particularly useful to tailor the polymer properties as just described.

The polymers of the invention may also be blended with other polymers such as polystyrenes, polyhydroxystyrenes, poly(meth)acrylates, polyimides, polyglutarimide, polysulfones, polyvinyl vinyl ethers, polyvinyl alcohols and polyvinyl acetates, among others.

Preferably the adhesive composition is a terpolymer composition of two different azo dye components and a phenol component. The preferred terpolymer composition of the azo dyes is illustrated below.

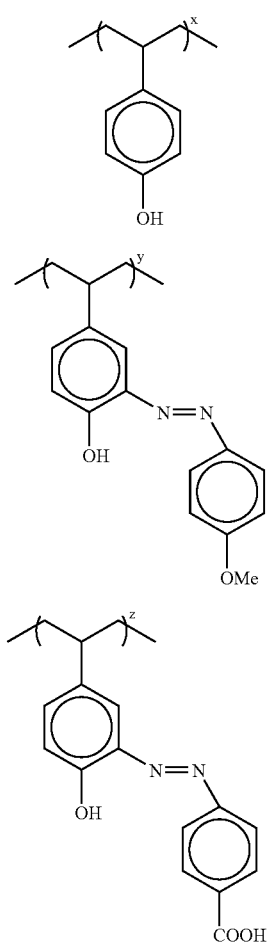

wherein x is 50, y is 25 and z is 25 mole-%, and x+y+z=100 mole-%.

In one embodiment of the invention, the terpolymer composition illustrated above, is incorporated into the PMGI release layer at concentrations in the range of 0.5 to 10 percent (by weight). The typical release layer thickness can be from 500 angstroms to 3 μm thick. This layer is typically softbaked at 130-200° C. for 10-30 minutes.

Lift Off Processing

Referring now to FIGS. 1-8, bi-layer lift-off processes are utilized when it is desired to produce well-defined patterns on a substrate surface by deposition techniques, such as evaporation or sputtering.

Figure 2:
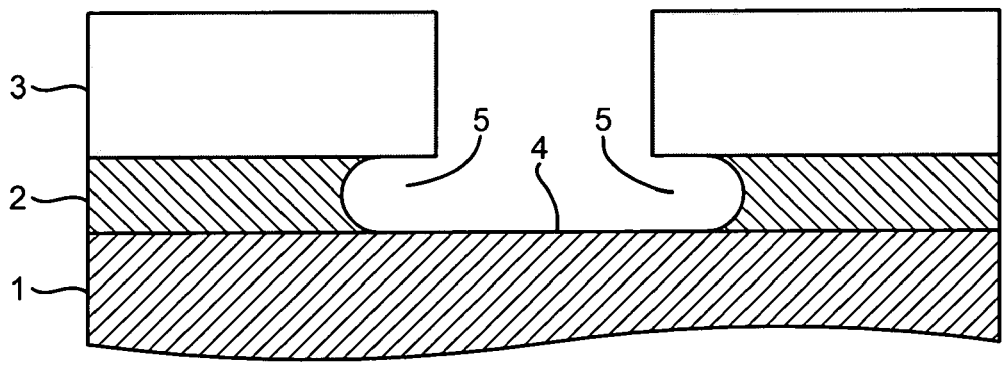
Figure 3:
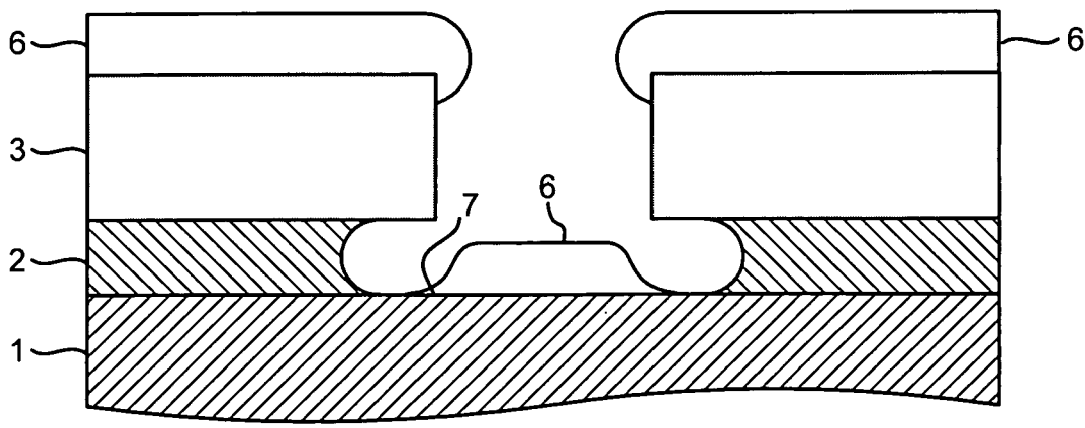

FIG. 1 shows a substrate 1 coated with a bi-layer which includes an organic release layer 2 which may comprise poly-dimethylglutarimide (PMGI) and the polymeric adhesive composition of the invention and a top imaging layer 3 of a suitable photoresist (referred to as "resist"). The resist layer 3 and the release layer 2 are then developed, resulting in the structure as shown in FIG. 2 with the substrate surface 4 exposed and the release layer 2 undercut 5 below the resist layer 3. A desired material, such as a conductive metal, is next deposited, such as by sputter deposition, for example, leading to the formation of a layer 6 covering the exposed substrate surface 4 and the top resist layer 3 as shown in FIG. 3. The amount of deposited material 7 extending into the undercut area 5 is primarily determined by the thickness of the release layer 2.

Figure 4:
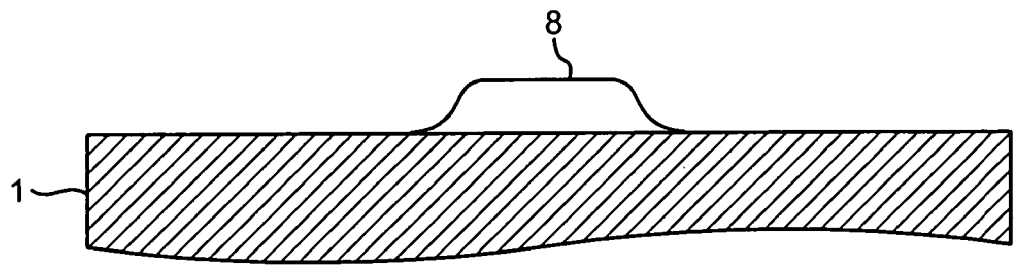

Finally, lift-off of the unwanted material 6 deposited over the top resist layer 3 is carried out using, for example, an organic solvent or aqueous alkali to dissolve the release layer and top resist layers releasing the deposited material 6. The end result is shown in FIG. 4 wherein the substrate 1 has been selectively coated with a patterned metal conductor 8, for example.

Figure 5:
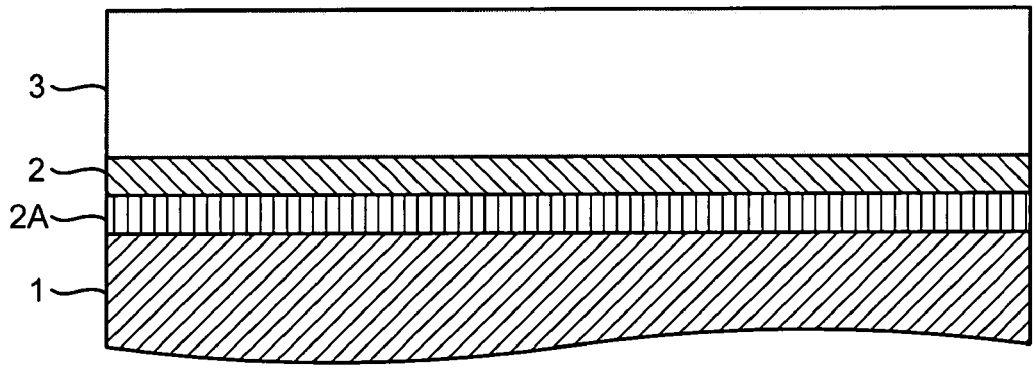
FIGS. 5-8 are cross-sectional views illustrating the structures formed during the steps of a tri-layer lift-off deposition process.
Figure 6:
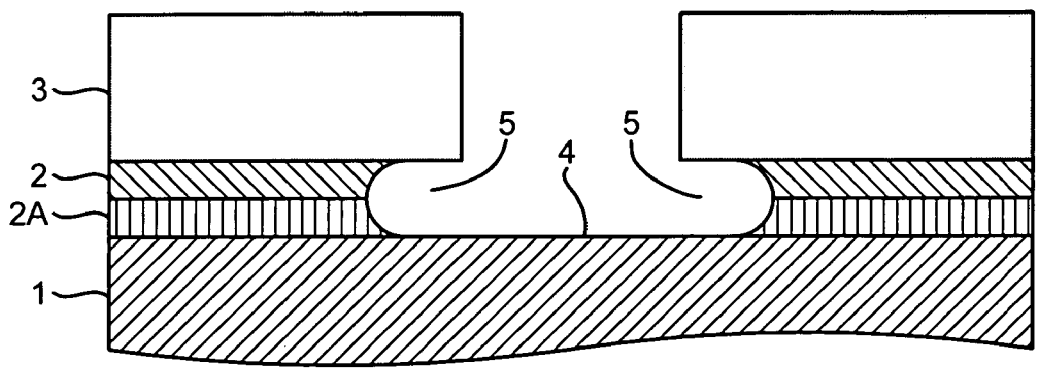
Figure 7:
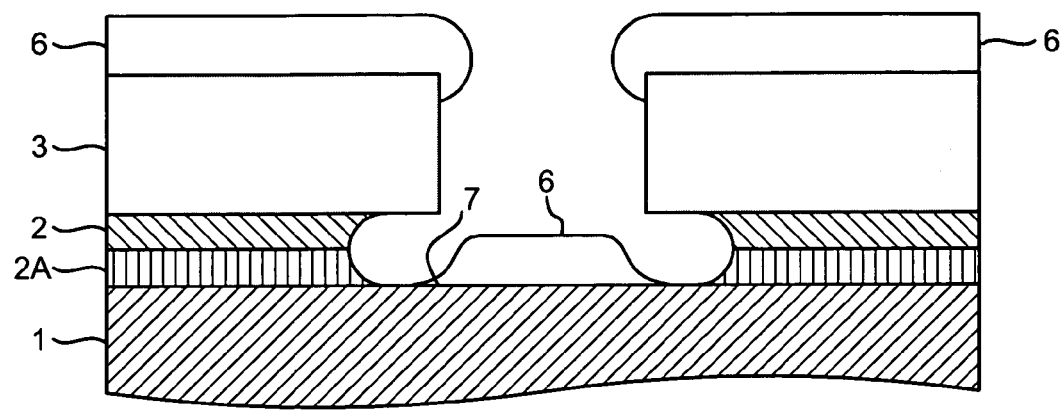
Figure 8:
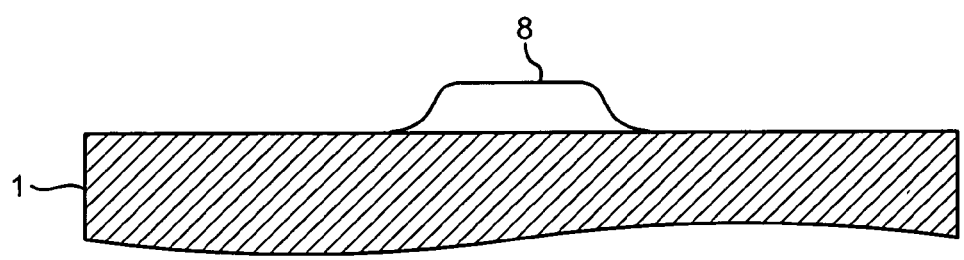

An alternative embodiment incorporates a separate layer of the polymeric adhesive composition of the invention between the release layer 2 and the substrate 4. FIG. 5 shows a substrate 1 coated with a tri-layer film which includes an adhesion promoter layer 2A, a release layer 2 of PMGI, and a top imaging layer 3 of a suitable photoresist (referred to as "resist"). The resist layer 3, release layer 2 and adhesion promoter layer 2A are developed, resulting in the structure as shown in FIG. 6 with the substrate surface 4 exposed and the release layer 2 and the adhesion promoter layer 2A undercut 5 below the resist layer 3. A desired material, such as a conductive metal, is next deposited, such as by sputter deposition, for example, leading to the formation of a layer 6 covering the exposed substrate surface 4 and the top resist layer 3 as shown in FIG. 7. The amount of deposited material 7 extending into the undercut area 5 is primarily determined by the thickness of the release layer 2 and adhesion promoter layer 2A. Finally, lift-off of the unwanted material 6 deposited over the top resist layer 3 is carried out using, for example, an organic solvent or aqueous alkali to dissolve the release layer 2, the adhesion promoter layer 2A and top resist layer 3 releasing the deposited material 6. The end result is shown in FIG. 8 wherein the substrate 1 has been selectively coated with a patterned metal conductor 8, for example.

Plating

Referring now to FIGS. 9-14, plate through mask processes are utilized when it is desired to produce well-defined patterns on a substrate surface by plating techniques.

Figure 9:
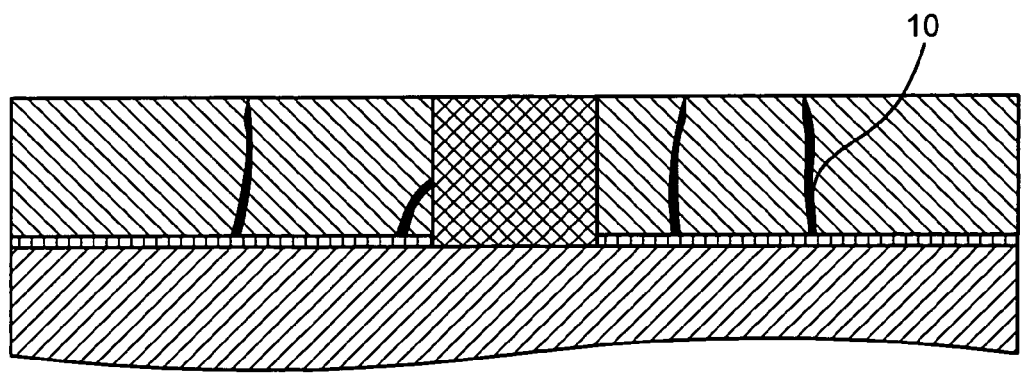
FIG. 9 is a cross-sectional view of a wafer plated using the plate-through-mask technique according to a prior art process.

FIG. 9 illustrates plated wafers according to a prior art process. For the current generation of write heads in development, high-moment NiFe plating is necessary at P1P and P2 to achieve the targeted magnetic performance. The low temperature and low pH required result in a plating environment with significant stress on the photoresist. As a result of the stress, the photoresist cracks during plating. More particularly, at the highest stress areas, metals press against the walls of the resist structure. The compression against the soft resist causes the resist to deform and crack. The plating solution fills the cracks 10 and if it makes contact with the seed layer, NiFe plates in the cracks, forming "fingers" 10 that plate into the cracks. When the resist is removed, the "fingers" 10 of plated metal remain on the substrate in various locations. The unwanted plating adversely affects functionality and reliability of the writer.

When the polymer described herein is applied to the seed layer prior to photoresist application, plating in resist cracks during plating is eliminated. The polymer forms a barrier layer between the photoresist and the seed layer. If the photoresist cracks, the plating solution will not make contact with the seed and will therefore not plate.

Figure 10:
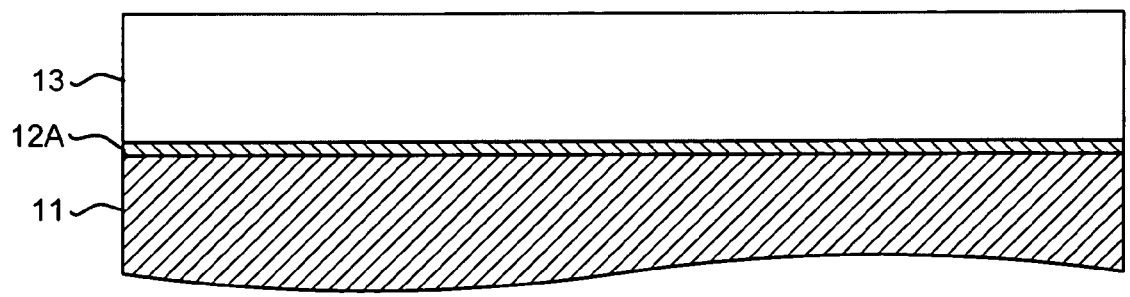
FIGS. 10-13 are cross-sectional views illustrating the structures formed during the steps of a bi-layer plate-through-mask process.

FIG. 10 shows a substrate 11 of any suitable platable material, such as Cu, NiFe, Au, etc. and alloys thereof. The substrate 11 is coated with a barrier layer 12 formed by spinning on the polymeric composition of the invention. In the preferred embodiment, the polymer is soluble in the resist and developer used during the plating process. The preferred polymer has monomeric units denoted as (IB) with the azo group denoted as (IX) above.

In spite of its solubility, the polymer sticks so well to the metal substrate 11 that a monolayer of the polymer remains after the photoresist is applied. The ability to form a monolayer provides a benefit in that virtually no undercut will be formed. The polymer has the added benefit of not affecting photolithographic conditions needed to print the poletip. This means that PHS-BTA can be implemented without extensive process changes and process requalification.

Figure 11:
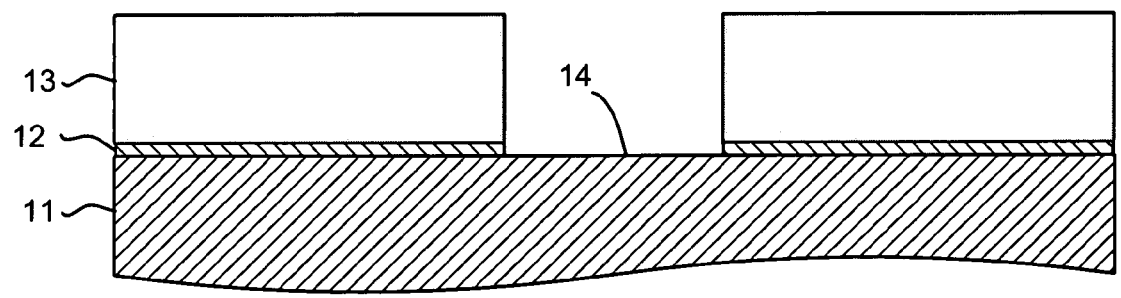

A top imaging layer 13 of a suitable photoresist (referred to as "resist") is formed above the barrier layer 12. The resist layer 13 and the barrier layer 12 are then exposed to developer, resulting in the structure as shown in FIG. 11 with the substrate surface 14 exposed. Because the barrier layer 12 is soluble in the developer, no additional step is required to remove the barrier layer 12 to expose the substrate 11.

Figure 12:
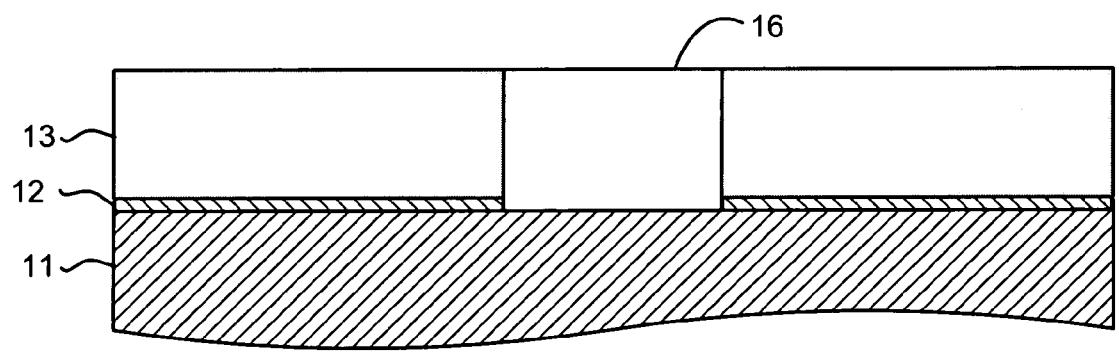
Figure 13:
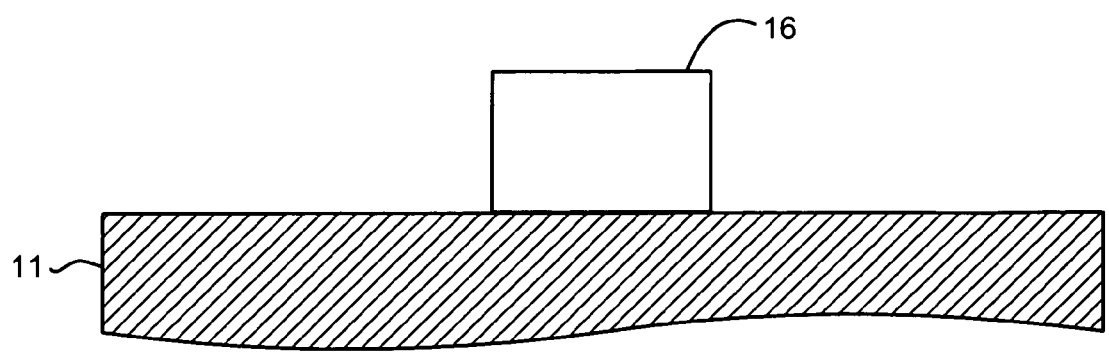

A desired material, such as a conductive metal like Cu, NiFe, etc., is next plated, leading to the formation of a layer 16 covering the exposed seed layer surface 14 as shown in FIG. 12. Finally, the top resist layer 13 is removed using, for example, an organic solvent or aqueous alkali to dissolve the barrier layer 12 and release the top resist layers 13. The end result is shown in FIG. 13 wherein the substrate 11 has been selectively plated with a patterned metal conductor 16, for example.

This problem of plating into cracks in the resist has been solved using the polymer as a barrier layer between the seed and resist like spin on ARC, dielectrics, tantalum, carbon, etc. The advantage of the polymer described herein is that, in magnetic head formation, it preserves the poletip geometry printed during photolithography (poletip geometry is critical to the performance of the write head).

Another embodiment uses a polymer that is not soluble in the resist, but that may or may not be soluble in the developer selected. Because the polymer is not soluble in the resist, the layer of polymer 12 between the substrate 11 and resist layer 13 is thicker.

In the case where the polymer is insoluble in developer, the developer does not create an undercut under the poletip, which could otherwise adversely affect poletip geometry. As mentioned above, because the polymer layer is insoluble in the developer, some other step must be used after developing to remove the polymer layer in areas to be plated. Reactive ion etching (RIE) or milling can then be used to remove the barrier layer 12 from the exposed region with little or no damage to the substrate 11. The RIE or milling step creates straight walls, because the polymeric barrier layer 12 is not undercut below the resist layer 13. In all cases, this step does not adversely affect the printed poletip geometry.

In the case where the polymer is soluble in the developer, the barrier layer will be undercut. The undercut is useful in some processes. Also, the barrier layer will be thicker than a monolayer, but thinner than the case where the polymer is insoluble in the developer. This makes subsequent RIE processing more easily performed.

As such, the designer can select the polymer and/or developer with the desired properties for the task at hand. For instance, where the barrier layer is to be also used as an antireflective coating, the barrier layer would preferably not be soluble in the developer so that a thicker layer of polymer is formed. After processing, the barrier layer can be removed by RIE.

In any of the above processes, the copolymer composition can be used as a separate adhesion promoter layer forming a tri-layer system. The adhesion promoter layer is between the substrate and the barrier layer. Typically the adhesion promoter layer is about 200-1000 Angstroms thick. This layer is typically softbaked at 130-190° C. for 10-30 minutes. The polymer may also be formed as an autonomous release layer without use of the PMGI binder. The top layer is preferably a photoresist. Typically the thickness of the photoresist can be from 0.5 to 5 µm. This layer is typically softbaked at 90-130° C. for 10-30 minutes.

For use in the present invention, the PMGI should preferably have a weight average molecular weight (polystyrene as a standard) within the range of 10,000 to 40,000. The choice of the molecular weight depends on the depth of undercut desired for specific applications, which is also a function of developer strength as well as temperature and development time. An absolute weight average molecular weight of approximately 20,000 is most preferred in the examples given above. Additionally, the glass transition temperature ($T_g$) of the PMGI resin should have a value within the range of 140° to 250° C. A $T_g$ of approximately 185° C., is most preferred in the examples given below.

The copolymer composition adheres to a variety of substrates such as metals, metal alloys, quartz, alumina and silicon dioxide. Additionally, formulations of the azo dyes in PMGI have exhibited a shelf-life of at least twelve months with minimum deterioration of desirable characteristics.

Generally, the organic underlayer (barrier layer) may be applied by spin coating and then optionally heat baked at temperatures ranging from about 90° C. to 250° C. for a period of time sufficient to evaporate any solvent present and, if necessary, cure the polymer. The photoresist may then be deposited by spin-coating and developed using actinic radiation at 193 nm, 248 nm, 365 mn, or 435 nm. The image may then be developed using any developer known to those of skill in the art.

In a preferred embodiment, the bi-layer resist system of the present invention can be adapted to deposit the electrical lead conductors in a magnetoresistive (MR) sensor. Since in an MR sensor the lead conductors also define the read track width, definition of the lead conductor structure is critical. Definition of the track width is determined by the degree or amount of undercut 5 (as shown in FIGS. 3 and 7). The amount of undercut 5 also determines the effectiveness of the lift-off. For a given set of thicknesses and PMGI composition, the amount of undercut generated is primarily a linear function of the development time and the prebake temperature for the PMGI release layer, the developer concentration and temperature being held constant.

The concentration of solvent, polymer, PMGI, and copolymer will vary depending on the application of the system. For example, if the polymer of the system is intended for use as an adhesion promoting layer film thickness is less critical, however, polymer concentration is of greater importance. If the polymer is to be used as a lift off layer, film thickness is more critical and can be varied by the concentration fo copolymer, PMGI, and solvent. Generally, the use concentrations can be varied within the guideline concentrations provided below.

|  | Concentration (wt-%) |
|---|---|
| solvent | 80 wt-% to 99 wt-% |
| PMGI* | 3 wt-% to 19 wt-% |
| Copolymer* | 0.5 wt-% to 5 wt-% |

*When present

WORKING EXAMPLES

The following example is a nonlimiting illustration of the invention.

Example 1

Conc. HCl (4.11 g) was diluted to 20.5 g with water. To this was added aniline (1.9) mL) using ice bath cooling. To this was added a saturated solution of sodium nitrite (1.44 g) in water.

Separately poly(4-hydroxystyrene) (5 g) and 50% NaOH (3.3 g) were dissolved into methanol (25 mL) using ice cooling. To this was added the first solution dropwise. After stirring for 1 hour con Hcl was added dropwise until pH+3. Approx. 100 mL water added to the reaction then filtered and sucked dry to give a brownish solid. This solid was taken up into a mixture of acetone/cyclohexanone (approx. 50 mL) and re-precipitated into water (750 mL), filtered, sucked dry then dried under high vacuum at 60 deg. C.

A 10% by weight solution of this polymer in cyclopentanone was spin coated onto a quartz wafer and baked at 150 deg C. for 2 min. The film had an optical density of 3/μm at 365 nm.

Example 2

The procedure of Example 1 was used replacing the aniline with p-anisidine (2.6 g).

A 10% by weight cyclopentanone solution of the polymer so produced was spin cast onto a quartz wafer and baked on a hot plate at 152 deg. C. for 2 min. The film had an optical density of 4.7/μm at 365 nm.

Example 3

The procedure of Example 1 was used replacing the aniline with p-aminobenzoic acid (2.86 g).

A 10% by weight cyclopentanone/NMP solution of the polymer produced was spin cast onto a quartz wafer and baked on a hot plate at 150 deg. C. for 2 min. The film had an optical density of 3.4/μm at 365 nm.

Example 4

Conc. HCl (68 mL) was added to a stirring ice-cooled mixture of p-anisidine (26 g) and p-aminobenzoic acid (28 g) in $H_2O$ (250 mL). Next a solution of $NaNO_2$ (28.8 g) in $H_2O$ (50 mL) was added maintaining temperature below 5° C.

Separately, 50% NaOH (76 g) was added to an stirring ice-cooled solution of poly(4-hydroxystyrene) 100 g) in 500 mL MeOH. Next, the diazonium solution prepared above was added slowly maintaining temperature below 5° C. After addition the reaction temperature was maintained at 0-5° C. for 1 hour, then allowed to come to room temperature and stir overnight.

The next day the reaction was cooled with ice and conc. HCl (168 mL) was added and stirred for 1 hour. The precipitate was filtered and rinsed with water. The solid was twice re-slurried in water (500 mL) and filtered, then rinsed with additional water and sucked dry. This polymer was then dried at 65° C. in a vacuum oven overnight affording approximately 150 g of a dark solid.

Example 5

The procedure of Example 1 was used replacing the aniline with o-nitroaniline (2.88 g).

Example 6

Copolymer from Example 3 (3.9 g) and 8N NaOH (50 mL) was dissolved in 50 mL EtOH and heated to 85-90° C. under nitrogen. To this was quickly added formamidinesulfinic acid (2.4 g). After 1 hour the reaction was cooled with an ice bath and acidified to pH+3 with con. HCl, filtered, rinsed with water, sucked dry then dried in a 65° C. vacuum oven overnight.

Example 7

50 g of the polymer prepared in Example 4 was dissolved into 282 g of cyclopentanone to give a 15% by weight solution.

Example 8

60 g of the solution prepared in Example 7 was dissolved into 1200 g of a 15% by weight solution of PMGI in cyclopentanone/NMP (Nano SFN15, MicroChem Corp). This solution was filtered through a 0.2 μm capsule filter prior to use.

Example 9

Alternatively, 1.9 g of the polymer prepared in Example 4 was dissolved directly into 262 g of a 15% by weight solution of PMGI in cyclopentanone/NMP (Nano SFN15, Micro-Chem Corp.). This solution was filtered through a 0.2 μm capsule filter prior to use.

Example 10

1 g of Adhesion Promoter Polymer from Example 4 was dissolved into 19 g of cyclopentanone and filtered through a 0.2 μm filter prior to use.

Example 11

A solution of PMGI (Nano SFN15, Microelectronic Chemicals Corp.) was spin cast (2500 rpm, 30 sec.) onto an alumina substrate and baked at 150° C. for 30 min. on a hot plate. Over this was applied photoresist (SJR 5440, Shipley Company) (3000 rpm, 30 sec.) and baked for 15 min. at 110° C. on a hot plate. The resist was then exposed through a mask and developed in 6/1 Microposit 2401 (Shipley Co.)/water at 20° C. for 460 sec. The wafer was next flood exposed under Deep UV light for 10 sec. and re-developed in 6/1 Microposit 2401/water at 20° C. for 15 sec. The result was massive adhesion loss from substrate.

Example 12

A solution of PMGI containing Adhesion Promoter prepared as in Example 10 was used in place of the PMGI described in Example 13. The result was no adhesion loss from substrate.

Example 13

A thin film of Adhesion Promoter was spin coated from the solution prepared in Example 12 (2500 rpm, 30 sec) onto an alumina substrate and baked on a hot plate for 5 min. at 150°. The wafer was then processed as described n Example 13. The result was no adhesion loss from substrate.

In the most preferred embodiment, the preparation of these polymers is by reaction of a diazonium salt directly with the phenolic polymer. The desired polymeric structure can also be achieved by polymerization of monomeric units containing the desired adhesion-promoting unit(s) (the ortho-hydroxyphenylazo containing monomers) and any other co-monomers.

In some applications it may also be necessary to minimize or eliminate the use of material that may leave metal or halide ions in the product polymer after manufacture. Therefore exchange non-ionic or organic materials for these materials, for example a tetraaklylammonium hydroxide for the sodium hydroxide an/or another non-halide acid such as trifluoracetic acid or trichloracetic acid or a sulfuric or sulfonic acid.

The reaction of the fast dyes and other commercially available diazonium salts to phenolic polymer backbones is analogous to other reactions where we form the diazonium salt in situ. These material are reacted directly with the polymeric phenoxide followed by neutralization or acidification.

Figure 14:
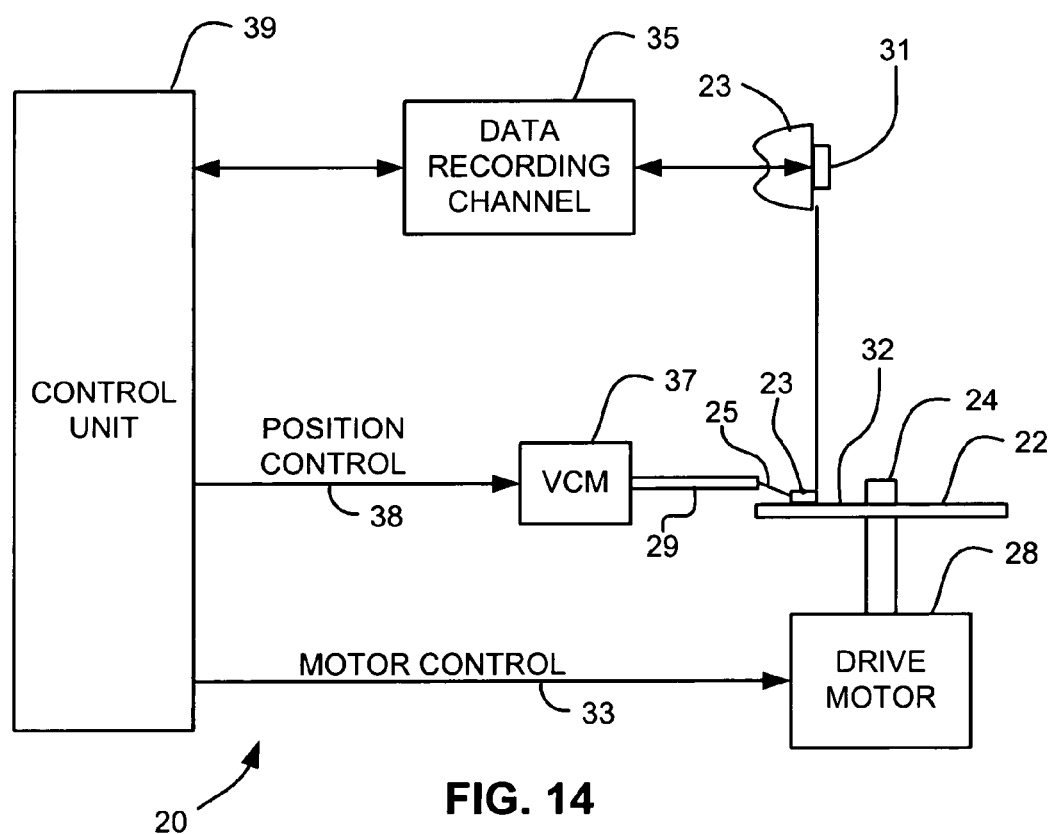
FIG. 14 is a perspective drawing of a magnetic disk drive system in accordance with one embodiment.

Referring now to FIG. 14, there is shown a disk drive 20 embodying the present invention. As shown in FIG. 14, at least one rotatable magnetic disk 22 is supported on a spindle 24 and rotated by a disk drive motor 28. The magnetic recording on each disk is in the form of an annular pattern of concentric data tracks (not shown) on the disk 22.

At least one slider 23 is positioned near the disk 22, each slider 23 supporting one or more magnetic read/write heads 31. As the disks rotate, slider 23 is moved radially in and out over disk surface 32 so that heads 31 may access different tracks of the disk where desired data are recorded. Each slider 23 is attached to an actuator arm 29 by means of a suspension 25. The suspension 25 provides a slight spring force which biases slider 23 against the disk surface 32. Each actuator arm 29 is attached to an actuator means 37. The actuator means 37 as shown in FIG. 14 may be a voice coil motor (VCM). The VCM comprises a coil movable within a fixed magnetic field, the direction and speed of the coil movements being controlled by the motor current signals supplied by controller 39.

During operation of the disk storage system, the rotation of disk 22 generates an air bearing between slider 23 and disk surface 32 which exerts an upward force or lift on the slider. The air bearing thus counter-balances the slight spring force of suspension 25 and supports slider 23 off and slightly above the disk surface by a small, substantially constant spacing during normal operation.

The various components of the disk storage system are controlled in operation by control signals generated by control unit 39, such as access control signals and internal clock signals. Typically, control unit 39 comprises logic control circuits, storage means and a microprocessor. The control unit 39 generates control signals to control various system operations such as drive motor control signals on line 33 and head position and seek control signals on line 38. The control signals on line 38 provide the desired current profiles to optimally move and position slider 23 to the desired data track on disk 22. Read and write signals are communicated to and from read/write heads 31 by way of recording channel 35.

The above description of a typical magnetic disk storage system, and the accompanying illustration of FIG. 14 are for representation purposes only. It should be apparent that disk storage systems may contain a large number of disks and actuators, and each actuator may support a number of sliders.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for plating, comprising:
    coating a substrate with a barrier layer, wherein the barrier layer comprises an adhesive composition comprising a polyphenolic polymer, said polyphenolic polymer comprising repeating monomeric units having the formula:

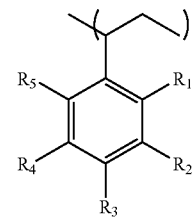

wherein each of $R_1$, $R_2$, $R_3$, $R_4$, and $R_5$ are each individually a hydroxy group, hydrogen, or an azo dye moiety;
    coating the barrier layer with a top layer comprising a photoresist;
    imagewise exposing the top layer to radiation;
    removing a portion of the top layer for exposing a portion of the barrier layer;
    removing the exposed portion of the barrier layer for exposing a portion of the substrate, wherein removal of the exposed portion of the barrier layer does not create undercuts under the photoresist; and
    plating a material on the exposed portion of the substrate.

2. A method as recited in claim 1, wherein the substrate includes a seed layer, the barrier layer being formed on the seed layer.

3. A method as recited in claim 1, wherein the barrier layer comprises 100% of the polyphenolic polymer.

4. A method as recited in claim 1, wherein the barrier layer is spin coated on the substrate.

5. A method as recited in claim 1, wherein the barrier layer is substantially formed in a monolayer.

6. A method as recited in claim 1, wherein only one of $R_1$, $R_2$, $R_3$, $R_4$, and $R_5$ is hydroxyl.

7. A method as recited in claim 1, wherein the exposed portion of the top layer is removed using a developer.

8. A method as recited in claim 7, wherein the developer also removes the exposed portion of the barrier layer.

9. A method as recited in claim 1, wherein removal of the exposed portion of the barrier layer creates undercuts under the photoresist.

10. A method as recited in claim 1, wherein the barrier layer also functions as an antireflective coating.

11. A method for plating,
    comprising,
    coating a substrate with a barrier layer, wherein the barrier layer comprises an adhesive composition comprising a polyphenolic polymer, said polyphenolic polymer comprising repeating monomeric units having the formula:

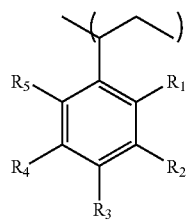

wherein each of $R_1$, $R_2$, $R_3$, $R_4$, and $R_5$ are each individually a hydroxy group, hydrogen, or an azo dye moiety;

coating the barrier layer with a top layer comprising a photoresist;

imagewise exposing the top layer to radiation;

removing a portion of the top layer for exposing a portion of the barrier layer;

removing the exposed portion of the barrier layer for exposing a portion of the substrate; and plating a material on the exposed portion of the substrate, wherein the exposed portion of the top layer is removed using a developer, wherein the developer does not remove the exposed portion of the barrier layer.

12. A method as recited in claim 11, wherein the exposed portion of the barrier layer is removed by reactive ion etching.

13. A method as recited in claim 11, wherein the exposed portion of the barrier layer is removed by milling.

14. A method for plating, comprising:

coating a substrate with a barrier layer, wherein the barrier layer comprises an adhesive composition comprising a polyphenolic polymer, said polyphenolic polymer comprising repeating monomeric units having the formula:

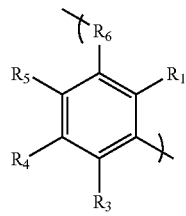

wherein each of $R_1$, $R_3$, $R_4$, and $R_5$ are each individually a hydroxy group, hydrogen, or an substituted azo group and $R_6$ is a methylene or substituted methylene group;

coating the barrier layer with top layer comprising a photoresist;

imagewise exposing the top layer to radiation;

removing a portion of the top layer for exposing a portion of the barrier layer;

removing the exposed portion of the barrier layer for a portion of the substrate; and plating a material on the exposed portion of the substrate.

15. A method as recited in claim 14, wherein the substrate includes a seed layer, the barrier layer being formed on the seed layer.

16. A method as recited in claim 14, wherein the barrier layer comprises 100% of the polyphenolic polymer.

17. A method as recited in claim 14, wherein the barrier layer is spin coated on the substrate.

18. A method as recited in claim 14, wherein the barrier layer is substantially formed in a monolayer.

19. A method as recited in claim 14, wherein only one of $R_1$, $R_3$, $R_4$, and $R_5$ is hydroxyl.

20. A method as recited in claim 14, wherein the exposed portion of the top layer is removed using a developer.

21. A method as recited in claim 20, wherein the developer also removes the exposed portion of the barrier layer.

22. A method as recited in claim 20, wherein the developer does not remove the exposed portion of the barrier layer.

23. A method as recited in claim 22, wherein the exposed portion of the barrier layer is removed by reactive ion etching.

24. A method as recited in claim 22, wherein the exposed portion of the barrier layer is removed by milling.

25. A method as recited in claim 14, wherein removal of the exposed portion of the barrier layer does not create undercuts under the photoresist.

26. A method as recited in claim 14, wherein removal of the exposed portion of the barrier layer creates undercuts under the photoresist.

27. A method as recited in claim 14, wherein the barrier layer also functions as an antireflective coating.

* * * * *